United States Patent
Jung et al.

(10) Patent No.: US 9,744,743 B2
(45) Date of Patent: Aug. 29, 2017

(54) ZN—MG ALLOY PLATED STEEL SHEET, AND METHOD FOR MANUFACTURING SAME

(71) Applicant: POSCO, Pohang-si, Gyeongsangbuk-do (KR)

(72) Inventors: Woo-Sung Jung, Gwangyang-si (KR); Seok-Jun Hong, Gwangyang-si (KR); Kyung-Hoon Nam, Gwangyang-si (KR); Dong-Yoeul Lee, Gwangyang-si (KR); Yong-Hwa Jung, Gwangyang-si (KR); Young-Jin Kwak, Gwangyang-si (KR); Mun-Jong Eom, Gwangyang-si (KR); Tae-Yeob Kim, Gwangyang-si (KR)

(73) Assignee: POSCO, Pohang-si,Gyeongsangbuk-do (KR)

( * ) Notice: Subject to any disclaimer, the term of this patent is extended or adjusted under 35 U.S.C. 154(b) by 41 days.

(21) Appl. No.: 14/758,222

(22) PCT Filed: Dec. 28, 2012

(86) PCT No.: PCT/KR2012/011751
§ 371 (c)(1),
(2) Date: Jun. 26, 2015

(87) PCT Pub. No.: WO2014/104445
PCT Pub. Date: Jul. 3, 2014

(65) Prior Publication Data
US 2015/0352812 A1    Dec. 10, 2015

(30) Foreign Application Priority Data
Dec. 26, 2012 (KR) .......................... 10-2012-0153981

(51) Int. Cl.
  *B32B 15/00* (2006.01)
  *B32B 15/01* (2006.01)
  (Continued)

(52) U.S. Cl.
  CPC ............ *B32B 15/013* (2013.01); *C22C 18/00* (2013.01); *C23C 14/16* (2013.01); *C23C 14/26* (2013.01);
  (Continued)

(58) Field of Classification Search
  None
  See application file for complete search history.

(56) References Cited

U.S. PATENT DOCUMENTS 5,002,837 A * 3/1991 Shimogori .............. C23C 14/16
                                                          428/621
5,135,817 A    8/1992 Shimogori et al.
(Continued)

FOREIGN PATENT DOCUMENTS

CN    1135537 A    11/1996
CN    1070932 C    9/2001
(Continued)

OTHER PUBLICATIONS

Japanese Office Action dated Jul. 19, 2016 issued in Japanese Patent Application No. 2015-551046 (English translation).
(Continued)

*Primary Examiner* — Daniel J Schleis
(74) *Attorney, Agent, or Firm* — McDermott Will & Emery LLP

(57) ABSTRACT

Provided are a Zn—Mg alloy plated steel sheet and a method for manufacturing same. The Zn—Mg alloy plated steel sheet comprises a base steel sheet and a Zn—Mg plating layer formed on the base steel sheet, wherein the content of Mg in the Zn—Mg plating layer is 8 weight % or less
(Continued)

(provided that 0 weight % is excluded), and the Zn—Mg plating layer is a compound phase of Zn and Mg2Zn11. According to the present invention, provided are a Zn—Mg alloy plated steel sheet and a method for manufacturing the same, wherein the Zn—Mg alloy plated steel sheet has excellent corrosion resistance, high adhesion, and superior surface quality of metallic luster.

5 Claims, 10 Drawing Sheets

(51) Int. Cl.
| C23C 14/26 | (2006.01) |
| C23C 14/30 | (2006.01) |
| C23C 14/34 | (2006.01) |
| C22C 18/00 | (2006.01) |
| C23C 14/16 | (2006.01) |
| C23C 14/56 | (2006.01) |

(52) U.S. Cl.
CPC .............. *C23C 14/30* (2013.01); *C23C 14/34* (2013.01); *C23C 14/3414* (2013.01); *C23C 14/562* (2013.01); *Y10T 428/12799* (2015.01)

(56) References Cited

U.S. PATENT DOCUMENTS

| 8,114,527 | B2 * | 2/2012 | Nagasawa .............. C09D 5/106 420/513 |
| 2008/0142125 | A1 | 6/2008 | Meurer et al. |
| 2010/0104752 | A1 | 4/2010 | Choquet et al. |
| 2010/0285333 | A1 | 11/2010 | Kwak et al. |
| 2013/0061986 | A1 | 3/2013 | Vanhee et al. |

FOREIGN PATENT DOCUMENTS

| CN | 101910466 A | 12/2010 |
| CN | 101952477 A | 1/2011 |
| EP | 0 594 520 A1 | 4/1994 |
| EP | 0730045 A2 | 9/1996 |
| EP | 0 756 022 A2 | 1/1997 |
| EP | 1 570 115 A2 | 9/2005 |
| EP | 1 693 477 A1 | 8/2006 |
| EP | 1 972 699 A1 | 9/2008 |
| EP | 2 098 607 A1 | 9/2009 |
| JP | 54-159340 A | 12/1979 |
| JP | 56-041360 A | 4/1981 |
| JP | 56-152955 A | 11/1981 |
| JP | 58-048692 A | 3/1983 |
| JP | 61-52953 A | 3/1986 |
| JP | 62-109966 A | 5/1987 |
| JP | 64-017851 A | 1/1989 |
| JP | 64-017853 A | 1/1989 |
| JP | 64-017855 A | 1/1989 |
| JP | 64-021066 A | 1/1989 |
| JP | 64-025990 A | 1/1989 |
| JP | 01-116062 A | 5/1989 |
| JP | 01-127683 A | 5/1989 |
| JP | H01139755 * | 6/1989 |
| JP | 02-097663 A | 4/1990 |
| JP | 02-194162 A | 7/1990 |
| JP | 03-039489 A | 2/1991 |
| JP | 04-032580 A | 2/1992 |
| JP | 04-147955 A | 5/1992 |
| JP | 06-248424 A | 9/1994 |
| JP | 07-157867 A | 6/1995 |
| JP | 07-188903 A | 7/1995 |
| JP | 07-268605 A | 10/1995 |
| JP | 08-003728 A | 1/1996 |
| JP | 08-060324 A | 3/1996 |
| JP | 08-081761 A | 3/1996 |
| JP | 08-239754 A | 9/1996 |
| JP | 2624272 B2 | 4/1997 |
| JP | 09-137267 A | 5/1997 |
| JP | 09-143658 A | 6/1997 |
| JP | 2002-226958 A | 8/2002 |
| JP | 2005-146340 A | 6/2005 |
| KR | 10-1993-0010217 B1 | 6/1993 |
| KR | 10-2002-0034485 A | 5/2002 |
| KR | 10-2002-0041029 A | 6/2002 |
| KR | 2005-0056398 A | 6/2005 |
| KR | 10-0775241 B1 | 11/2007 |
| KR | 10-2009-0072381 A | 7/2009 |
| WO | WO-02/06558 A1 | 1/2002 |
| WO | 2009/084848 A2 | 7/2009 |

OTHER PUBLICATIONS

Ohinese Office Action dated Jul. 4, 2016 issued in Chinese Patent Application No. 201280077973.4.
B. Schuhmacher, et al., "Innovative steel strip coatings by means of PVD in a continuous pilot line: process technology and coating development," Surface and Coatings Technology, 2003, pp. 703-709.
International Search Report issued in International Application No. PCT/KR2012/011751 with Date of mailing Jul. 3, 2013, with English Translation.
Extended European Search Report dated Sep. 1, 2015 issued in European Patent Application No. 12891070.0.
M. Lee, et al., "Effect of interlayer insertion on adhesion properties of Zn—Mg thin films on steel substrate of PVD method," Current Applied Physics, vol. 12, Feb. 9, 2012, pp. S2-S6.

* cited by examiner

[Figure 1]
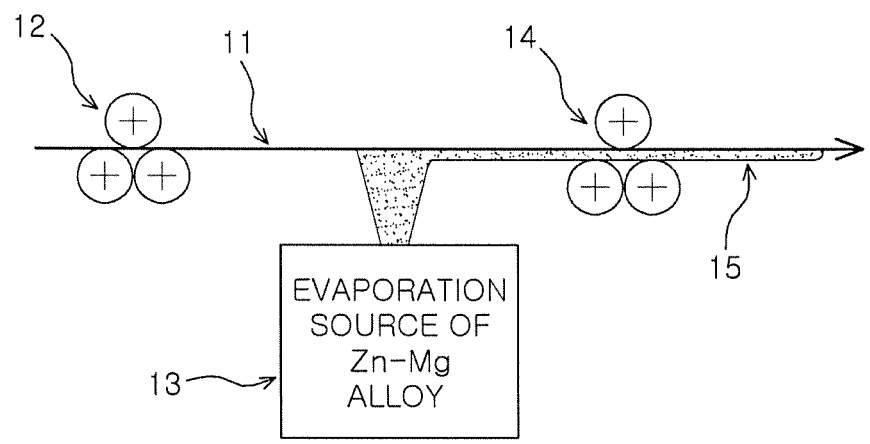

[Figure 2]
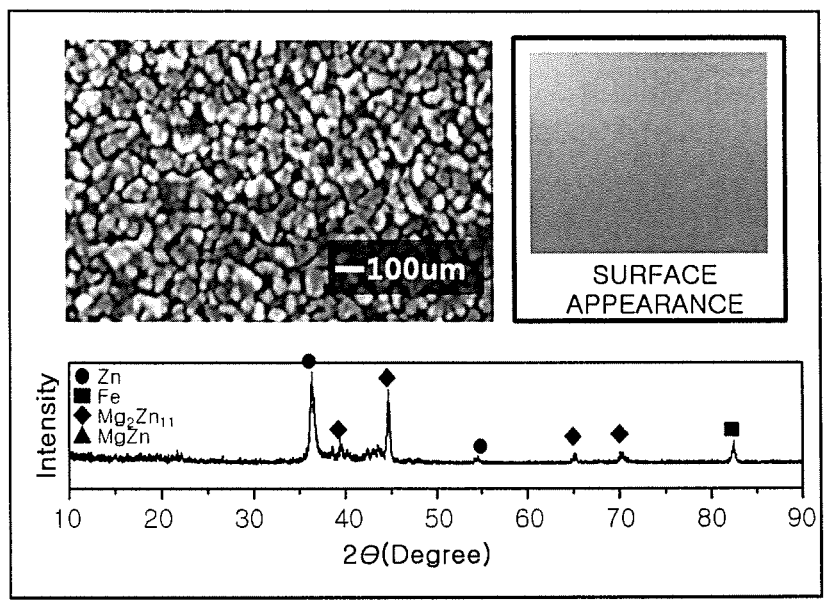

[Figure 3]
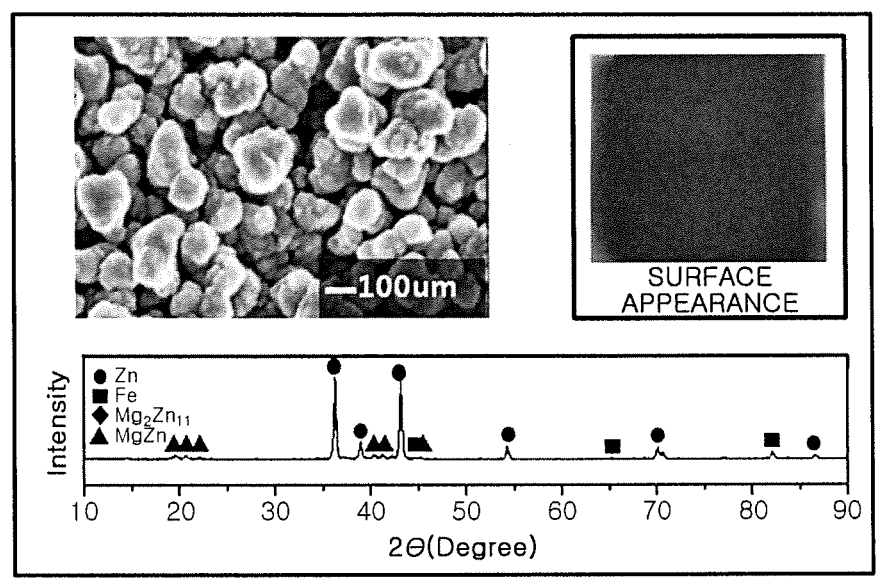

[Figure 4]
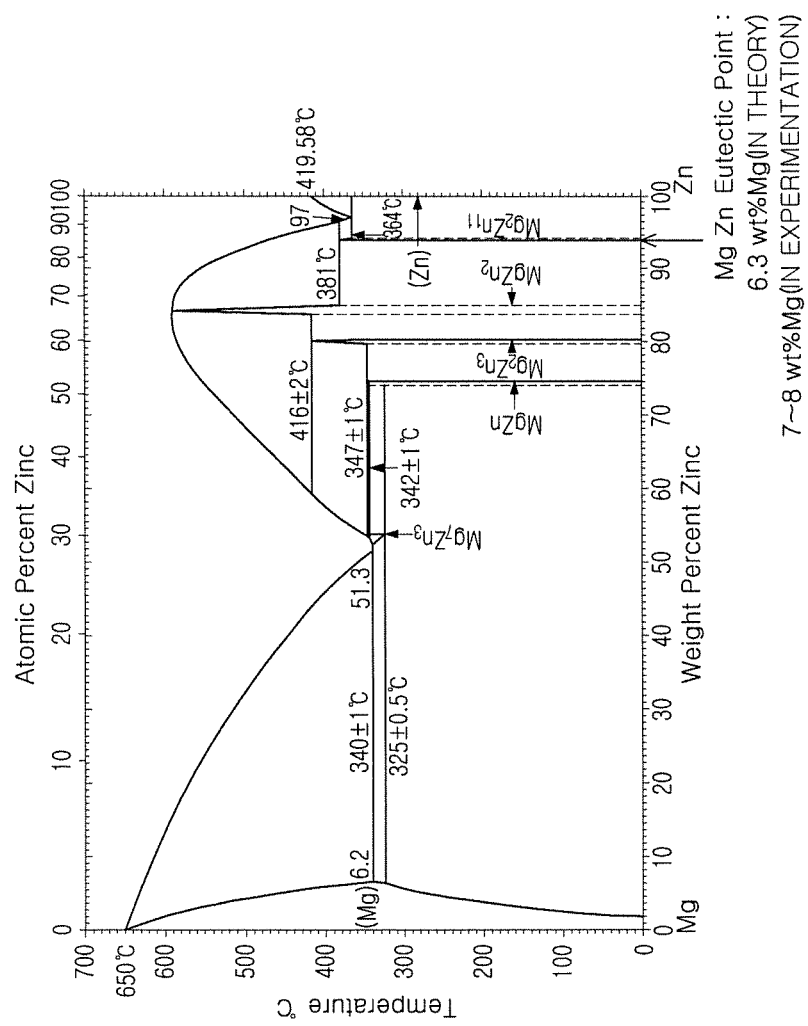

[Figure 5]
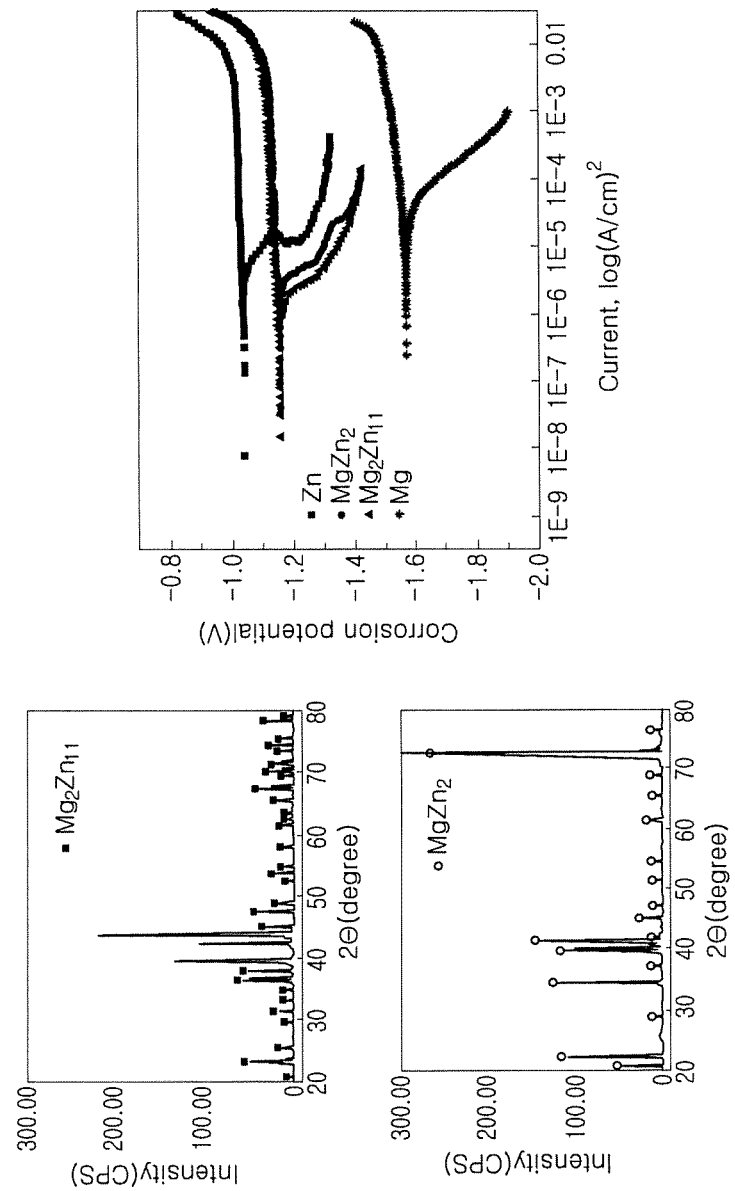

[Figure 6]
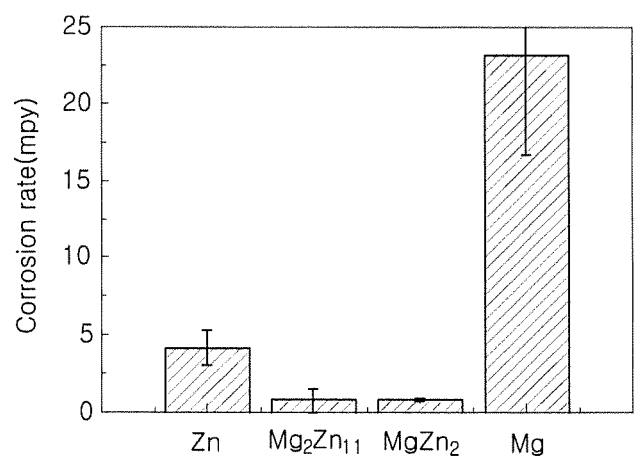

[Figure 7]

| STEEL SHEET TEMPERATURE | 150°C | 100°C | 60°C |
|---|---|---|---|
| OPTICAL IMAGE (SPOT ON SURFACE OF STEEL SHEET) | (SPOTS PRESENT) | (SPOTS PRESENT) | (NO SPOTS PRESENT) |
| SEM IMAGE | | | |
| AVERAGE SIZE OF SURFACE GRAINS | 200 μm OR GREATER | 121 μm | 90 μm |

[Figure 8]
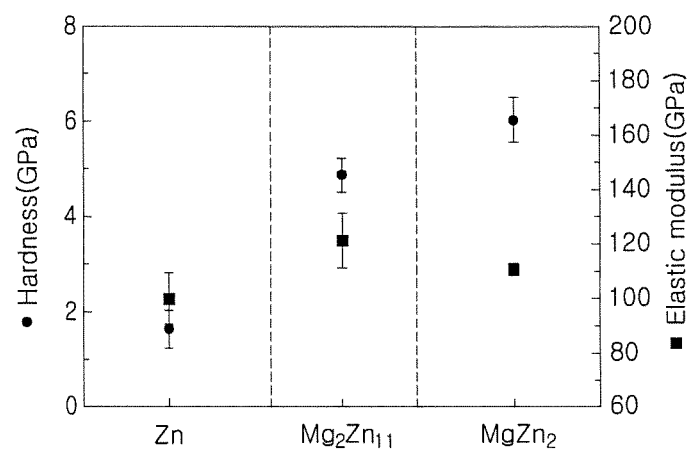

[Figure 9]
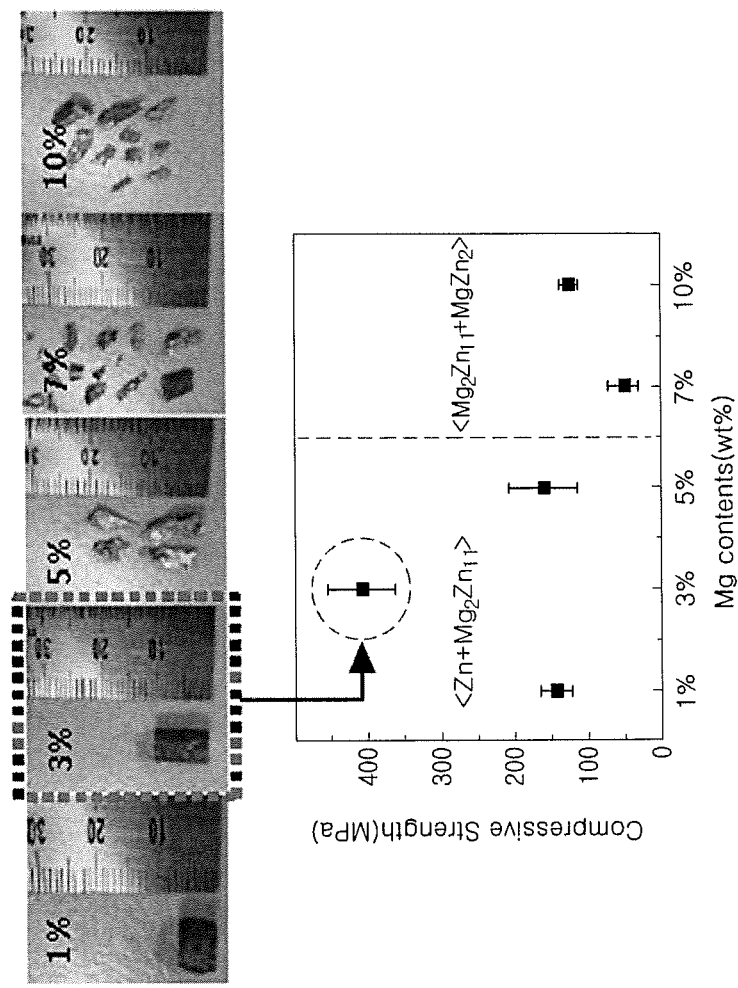

[Figure 10]
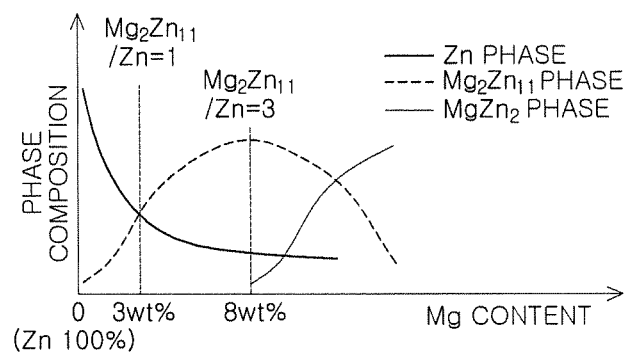

ZN—MG ALLOY PLATED STEEL SHEET, AND METHOD FOR MANUFACTURING SAME

RELATED APPLICATIONS

This application is a national phase of International Application No. PCT/KR2012/011751, filed on Dec. 28, 2012, which in turn claims the benefit of Korean Application No. 10-2012-0153981, filed on Dec. 26, 2012, the disclosures of which Applications are incorporated by reference herein.

TECHNICAL FIELD

The present disclosure relates to a zinc (Zn)-magnesium (Mg) alloy-plated steel sheet and a method of manufacturing the same.

BACKGROUND ART

As Zn—Mg alloy plating has high corrosion resistance, a variety of products having a Zn—Mg alloy or single-layer or multi-layer Zn—Mg—X (X=Al, Ni, Cr, Pb, Cu, and the like) alloy including a third element have been developed. In addition, a variety of methods of manufacturing such products, such as hot dipping, vacuum deposition, alloying, and the like, have been used.

Recently, relatively many steel companies including Nisshin Steel (see Patent Document 1), POSCO (see Patent Document 2), Hyundai Hysco (see Patent Document 3), and the like have applied for patents related to Zn—Mg alloys.

However, in a case in which a Zn—Mg alloy film is formed using a conventional hot-dip process, when an Mg-added molten metal bath is exposed to air, a relatively large amount of dross may be formed therein due to oxidation of the Mg element, and in some cases, the molten metal bath may even ignite, which may be dangerous. For these reasons, a plating process may not be performed appropriately, or may be impossible to perform. Further, fumes generated from Mg, highly toxic to the human body, may pose a danger to steelworkers, as well as cause air pollution, and thus, the usage of Mg is significantly restricted.

In order to resolve such problems with a Zn—Mg alloy plating occurring when the hot-dip process is performed, a variety of patent applications providing a method of manufacturing a Zn—Mg alloy film using vacuum deposition (e.g. thermal evaporation, electron beam, sputtering, ion-plating, electromagnetic levitation physical vapor deposition, etc.) have been filed, but the methods disclosed in these patent applications merely provide methods of forming alloy films, without identifying the principle behind improved corrosion resistance of the Zn—Mg alloys disclosed therein. A common problem with such methods is that phases of such Zn—Mg alloys may include $Mg_2Zn_{11}$, $MgZn_2$, MgZn, and $Mg_7Zn_3$, all intermetallic compounds having a higher brittleness than a brittleness of Zn or Mg. Thus, a relatively large amount of cracks or a peeling-off phenomenon may occur when a steel sheet is processed, and thus, the practical application of such steel sheets may be almost impossible. In particular, in a case in which an alloy heat treatment process is also performed, a Fe—Zn intermetallic compound may be formed due to counter diffusions of Fe and Zn at an interface between a steel sheet and Zn or a Zn—Mg alloy. Thus, adhesion thereof may be further degraded.

In addition, in a case in which an Mg content is decreased in a Zn—Mg alloy thin film in order to resolve the problem of degraded adhesion, corrosion resistance may not be significantly obtained, or as a size of a grain thereof is increased, the number of voids in the thin film may increase, and thus, a surface roughness thereof may be increased, and thus, various forms of spots may appear, and surface defects may occur as a surface color thereof is darkened.

RELATED ART DOCUMENT (Patent Document 1) Japanese Patent Laid-Open Publication No. 2005-146340
(Patent Document 2) Korean Patent Laid-Open Publication No. 2002-0041029
(Patent Document 3) Korean Patent Laid-Open Publication No. 2005-0056398

DISCLOSURE

Technical Problem

An aspect of the present disclosure may provide a Zn—Mg alloy-plated steel sheet having excellent corrosion resistance, a strongly adhesive plating layer, and superior surface properties, and a method of manufacturing the same.

Technical Solution

According to an aspect of the present disclosure, a Zn—Mg alloy-plated steel sheet may include a base steel sheet and a Zn—Mg plating layer formed on the base steel sheet, wherein an Mg content of the Zn—Mg plating layer is 8 wt % or less (but above 0 wt %), and the Zn—Mg plating layer is a complex phase of Zn and $Mg_2Zn_{11}$.

According to another aspect of the present disclosure, a method of manufacturing a Zn—Mg alloy-plated steel sheet may include preparing a base steel sheet, and forming a Zn—Mg plating layer by evaporating a Zn—Mg alloy source to be deposited on a surface of the base steel sheet, wherein an Mg content of the Zn—Mg plating layer is 8 wt % or less (but above 0 wt %) and temperature of the base steel sheet before and after the Zn—Mg plating layer is deposited thereon may be 60° C. or lower.

Advantageous Effects

According to exemplary embodiments of the present disclosure, a Zn—Mg alloy-plated steel sheet having excellent corrosion resistance, high adhesiveness, and superior metallic luster on a surface thereof, and a method of manufacturing the same may be provided.

DESCRIPTION OF DRAWINGS

FIG. 1 is a view illustrating a process of manufacturing a Zn—Mg alloy-plated steel sheet according to an exemplary embodiment of the present disclosure;

FIG. 2 is a table providing photos of surface grains and surface appearance of a Zn—Mg alloy-plated steel sheet according to an exemplary embodiment of the present disclosure, and results of phase analysis of the Zn—Mg alloy-plated steel sheet according to the exemplary embodiment of the present disclosure performed through X-ray diffraction analysis method;

FIG. 3 is a table providing photos of surface grains and surface appearance of a Zn—Mg alloy-plated steel sheet according to a comparative example, and phase analysis of the Zn—Mg alloy-plated steel sheet according to the comparative example performed through X-ray diffraction analysis method;

FIG. 4 is a phase diagram of an Mg—Zn binary alloy indicating a eutectic point of $Mg_2Zn_{11}$, according to an exemplary embodiment of the present disclosure;

FIG. 5 is a view illustrating results of X-ray diffraction analysis and corrosion resistance analysis of monocrystals of $Mg_2Zn_{11}$ and $MgZn_2$ according to an exemplary embodiment of the present disclosure;

FIG. 6 is a view illustrating corrosion rate of $Mg_2Zn_{11}$ according to an exemplary embodiment of the present disclosure;

FIG. 7 is a view illustrating miniaturized grain size of a Zn—Mg alloy plating layer as temperature of a steel sheet decreases;

FIG. 8 is a graph illustrating results of elasticity evaluation of a $Mg_2Zn_{11}$ phase and a $MgZn_2$ phase;

FIG. 9 is a graph illustrating results of compressive strength evaluation of a complex phase of $Zn+Mg_2Zn_{11}$; and FIG. 10 is a graph illustrating change of a phase of a Zn—Mg alloy thin film as an Mg content thereof increases.

BEST MODE

Hereinafter, a zinc (Zn)-magnesium (Mg) alloy-plated steel sheet and a method of manufacturing the same will be described in detail.

According to an exemplary embodiment of the present disclosure, a Zn—Mg alloy-plated steel sheet may have a structure in which an alloy-plated layer of thin-film form may cover a surface of a hot-rolled steel sheet or a cold-rolled steel sheet. The Zn—Mg alloy-plated steel sheet may have excellent corrosion resistance, excellent adhesiveness, and a high-quality surface, which may be obtained by controlling an Mg content of the thin film, a phase thereof, and grain size thereof.

To this end, a Zn—Mg alloy-plated steel sheet according to an exemplary embodiment of the present disclosure may include a base steel sheet and a Zn—Mg plating layer formed on the base steel sheet. Here, an Mg content of the Zn—Mg plating layer is 8 wt % or less (but above 0 wt %), and the Zn—Mg plating layer is a complex phase of Zn and $Mg_2Zn_{11}$.

As an Mg content of a Zn—Mg alloy is increased, brittleness as well as corrosion resistance, strength, and hardness of the Zn—Mg alloy is increased. Thus, in a case in which the Zn—Mg alloy has a relatively high Mg content, Mg may hinder the growth of Zn grains, and thus, an amorphous crystal having a high level of brittleness may be formed. In general, in a case in which a Zn—Mg alloy has an Mg content of 20 wt % to 25 wt %, corrosion resistance thereof may be reduced. Thus, an Mg content of a Zn—Mg alloy is generally managed to be about 10 wt %, but in terms of brittleness, the Mg content of 10 wt % in the Zn—Mg alloy is relatively high. Thus, in a case in which a Zn—Mg alloy has an Mg content of about 10 wt %, the Zn—Mg alloy thin film may have an inferior adhesiveness due to brittleness. However, in a case in which the Mg content of the Zn—Mg alloy is decreased, to obtain a higher degree of adhesiveness, spots may appear on a surface thereof, leading to surface defects.

As described above, finding an optimal condition for obtaining a Zn—Mg alloy plating layer having excellent corrosion resistance, excellent adhesiveness, and superior surface properties may be difficult.

First, relatively the most desirable conditions in terms of corrosion resistance should be identified.

To identify the desirable conditions, a characteristic evaluation was performed using a Zn—Mg single phase. Samples of a $Mg_2Zn_{11}$ single phase and a $MgZn_2$ single phase were produced, and then levels of corrosion resistance of the samples were evaluated. The results of the evaluation are provided in FIG. 5 and FIG. 6. In general, corrosion resistance of a Zn—Mg alloy phase is greater than corrosion resistance of Zn by up to 20 times. Increased corrosion resistance of a Zn—Mg alloy is caused by the formation of a range of alloy phases thereof. In the evaluation process, a $Mg_2Zn_{11}$ phase had the highest corrosion resistance among Zn—Mg alloy phases. In addition, as illustrated in FIG. 8 providing results of evaluation of hardness and elasticity, mechanical characteristics having a relatively close relationship with adhesiveness, a $Mg_2Zn_{11}$ phase had a greater resistance to deformation than a resistance to deformation of a $MgZn_2$ phase.

However, as described above, a Zn—Mg alloy phase, intermetallic compound, may have not only relatively great strength but also increased brittleness, and thus, adhesiveness thereof may be degraded. Accordingly, a thin film including a complex phase of ductile Zn and $Mg_2Zn_{11}$ has been designed to counteract brittleness thereof increasing due to a formation of an alloy phase. The foregoing thin film has been designed considering that when a complex phase of a $Mg_2Zn_{11}$ phase having not only the relatively the highest corrosion resistance but also basic brittleness and Zn having a basic corrosion resistance and great elasticity is formed, a high level of adhesiveness may be obtained through mutual supplementation thereof. As illustrated in FIG. 9, when various complex phases were produced and compressive strength thereof was evaluated, a $Zn+Mg_2Zn_{11}$ complex phase had relatively the highest compressive strength. The $Zn+Mg_2Zn_{11}$ complex phase had relatively the highest compressive strength, because Zn therein absorbed and buffered stress occurring in a manufacturing process thereof, and $Mg_2Zn_{11}$ therein had relatively great resistance to deformation.

In order to form a $Zn+Mg_2Zn_{11}$ complex phase, an Mg content thereof should be set to be a eutectic point of $Mg_2Zn_{11}$ or below in a phase diagram of Mg—Zn binary alloy in FIG. 4. In theory, the Mg content is set to be 6.3 wt % or less, but the $Zn+Mg_2Zn_{11}$ complex phase appeared when the Mg content is 7 to 8 wt % or less in experimentation, which may be due to a characteristic of a so-called vapor deposition process.

In detail, in order to obtain relatively the highest corrosion resistance and adhesiveness, a phase ratio of Zn to $Mg_2Zn_{11}$ in the $Zn+Mg_2Zn_{11}$ complex phase may be desirably adjusted to be 1:1 to 1:3.

Finally, in order to obtain alloy plating having no surface defect, grain size of a plating layer may be miniaturized. In a case in which grain size of a plating layer is relatively large, illumination intensity of a surface thereof may increase, and black spots may appear because of diffused reflection occurring as light is absorbed into a void between grains thereof. Thus, when an average size of surface grains of the Zn—Mg alloy-plated steel sheet is 90 μm or less (but above 0 μm), the Zn—Mg alloy-plated steel sheet has relatively high-quality surface having no spots.

A thickness of the Zn—Mg plating layer may be desirably 1 μm to 3 μm. In a case in which the thickness of the Zn—Mg plating layer is less than 1 μm, significant improvement of corrosion resistance thereof may not be expected due to relatively too small thickness. In a case in which the thickness of the Zn—Mg plating layer is greater than 3 μm, corrosion resistance thereof may be improved, but powdering may occur due to a manufacturing process thereof, and relatively high costs may be incurred.

Hereinafter, a method of manufacturing a Zn—Mg alloy-plated steel sheet having the same characteristics as the aforementioned characteristics will be described, referring to FIG. 1.

A base steel sheet 11 may be prepared, and a Zn—Mg plating layer 15 may be formed by evaporating a Zn—Mg alloy source 13 to be deposited on a surface of the base steel sheet 11. For the base steel sheet 11, a cold-rolled steel sheet or a hot-rolled steel sheet may be used. According to an exemplary embodiment of the present disclosure, Zn and Mg are not individually deposited, but may be deposited on the surface of the base steel sheet 11 by evaporating the Zn—Mg alloy source.

In order to set an Mg content of a Zn—Mg plating layer to be equal to the eutectic point of $Mg_2Zn_{11}$ or less, a method of adjusting a weight ratio of Zn to Mg in a Zn—Mg alloy source may be used. The weight ratio of Zn to Mg in the Zn—Mg alloy source may vary depending on a method of coating. For example, when an electromagnetic levitation induction heating process is performed, the weight ratio of Zn to Mg in the Zn—Mg alloy source may be 75:25, in which 25 may be an upper limit of Mg content. When an electron beam process, a thermal evaporation process, or the like is performed, the weight ratio of Zn to Mg in the Zn—Mg alloy source may be 70:30, in which 30 may be an upper limit of Mg content. When a sputtering process is performed, the weight ratio of Zn to Mg of a target may be 92:8, in which 8 may be an upper limit of Mg content. When an alloy source having such a weight ratio of Zn to Mg is used, an Mg content of the Zn—Mg plating layer may be adjusted to be 8 wt % or less (but above 0 wt %). In theory, an Mg content may be adjusted to be 6.3 wt % or less as described above, but adjusting the Mg content to be 7 to 8 wt % or less turned out to be appropriate in experimentation.

As described above, a $Zn+Mg_2Zn_{11}$ complex phase may be obtained by adjusting an Mg content thereof, and thus, excellent corrosion resistance may be obtained and brittleness may be reduced.

In order to deposit the Zn—Mg alloy source, a vacuum deposition process may be used after foreign objects and a natural oxide film are removed from a surface of a base steel sheet using plasma and an ion beam. Here, a traditional vacuum deposition process such as an electron beam process, a sputtering process, a thermal evaporation process, an induction heating evaporation process, an ion plating process, and the like may be used. Desirably, an electromagnetic levitation induction heating process enabling high speed deposition and having an electromagnetic stirring effect may be used for improvements in productivity. A degree of vacuum during a deposition process may be adjusted to be $1.0 \times 10^{-2}$ mbar to $1.0 \times 10^{-5}$ mbar so that brittleness may be prevented from increasing due to a formation of an oxide, and material property may be prevented from being decreased, during a formation of a thin film.

When a temperature of the base steel sheet is adjusted to be 60° C. or less before and after the deposition process is performed, rapid growth of surface grains thereof may be prevented, and thus, average size of the surface grains of a finally formed Zn—Mg alloy-plated steel sheet may be miniaturized to 90 μm or less. Through such a process, a surface defect such as spots on a surface thereof may be prevented from occurring, and fine metallic luster on the surface thereof may be obtained. In order to adjust temperature of the base steel sheet, a method of cooling the base steel sheet before and after a deposition process is performed may be used, by installing cooling rolls 12 and 14. When it comes to cooling devices, in order to obtain significant cooling efficiency in a vacuum state, a plurality of cooling rolls may be installed, rather than a single cooling roll, to significantly increase an interface thereof. In particular, a rise in the temperature of the steel sheet may be significant after a coating process due to coating latent heat. Thus, after the coating process, increasing cooling efficiency and managing the temperature of the cooling rolls to be relatively low by increasing the number or size of the cooling rolls may be desirable.

According to an experiment performed by inventors of the present disclosure, when an Mg content of a Zn—Mg alloy plating layer was decreased, spots noticeably appeared on a surface thereof, but when the temperature of the base steel sheet was decreased, the spots gradually disappeared. FIG. 7 is a table providing surface appearance and average size of surface grains of a Zn—Mg plating layer when the Zn—Mg plating layer is formed under a condition in which an Mg content thereof is 3 wt % while a temperature of the base steel sheet is changed from 150° C. to 100° C. to 90° C. before and after a deposition process is performed. Although a composition of the Zn—Mg plating layer is not changed, as the temperature of the base steel sheet is decreased, the average size of the grains thereof decreases, and thus, spots are prevented from appearing on the surface thereof.

When a Zn—Mg plating layer was coated under a condition in which the temperature of a steel sheet was 100° C. or higher before a deposition process, and the temperature was increased to 162° C. after the deposition process, while an Mg content was 3 wt %, equal to the eutectic point of $Mg_2Zn_{11}$ or less, in an Mg content section according to an exemplary embodiment of the present disclosure, surface grains were significantly large (average grain size: 237 μm), and spots appeared due to voids therein. Here, photos of the surface grains and surface appearance of the Zn—Mg alloy-plated steel sheet, and results of phase analysis of the Zn—Mg alloy-plated steel sheet performed through X-ray diffraction analysis are provided in FIG. 3.

On the other hand, when the temperature of a steel sheet was controlled to be 60° C. or less before and after a deposition process was performed while an Mg content of a Zn—Mg plating layer was 3 wt % or less, spots did not appear on a surface of the Zn—Mg plating layer due to miniaturized surface grains (average grain size: 90 μm or less). In such a case, photos of surface grains and surface appearance of the Zn—Mg alloy-plated steel sheet, and results of phase analysis thereof performed through X-ray diffraction analysis are provided in FIG. 2.

Hereinafter, detailed description will be provided with reference to an exemplary embodiment of the present disclosure. The following exemplary embodiment of the present disclosure is provided for a clear understanding of the present disclosure, and may not be limited thereto.

Exemplary Embodiment 1 of the Present Disclosure

Foreign objects and a natural oxide film are removed from a surface of a cold-rolled steel sheet through plasma pre-processing inside a vacuum chamber, and then a Zn—Mg thin film is coated on the cold-rolled steel sheet using an electromagnetic levitation induction heating deposition process, a type of vacuum deposition process. Subsequently, Zn—Mg alloy-plated steel sheets are produced, under conditions in which temperature of the steel sheet and Mg content (wt %) of the Zn—Mg thin film are changed while the steel sheet is cooled or not cooled before and after the Zn—Mg thin film is formed, as provided in Table 1.

An average size of surface grains of the Zn—Mg alloy-plated steel sheet produced using the foregoing process is measured using a scanning electron microscope (SEC) and an image analyzer. Surface color thereof is evaluated through optical image, and adhesiveness thereof is evaluated using an OT bending test generally used when adhesiveness of a plated steel sheet is evaluated. A phase composition of the thin film is analyzed using an X-ray refraction analysis process. In order to measure corrosion resistance thereof, a sample is inserted into a neutral salt spray tester, and then time consumed until 5% of rust is generated is measured based on ASTM B-117.

The results of the aforementioned measurements and evaluations are provided in Table 1 below. Here, a comparison evaluation of an electric zinc-plated steel sheet EG having a plating thickness of about 3 μm is also performed.

size may grow, an Mg content hindering such growth is relatively small. A structure and results of analysis thereof are provided in FIG. 3.

In No. 5 in Table 1, the steel sheet is cooled, but as an Mg content of a thin film is set to be 8 wt % or higher, a $MgZn_2$ phase is formed, and thus, adhesiveness of the thin film is inferior.

On the other hand, No. 3 and No. 4 in Table 1, satisfying the exemplary embodiment of the present disclosure, have relatively excellent corrosion resistance and plating adhesiveness, and a relatively fine metallic luster on a surface thereof.

In particular, No. 4 has the highest corrosion resistance thereamong, because the number of $Mg_2Zn_{11}$ phases having greater corrosion resistance than that of a $MgZn_2$ phase was higher than in No. 3 and No. 2, as provided in FIG. 5, providing results of corrosion resistance evaluation of every Zn—Mg alloy phase performed using a monocrystal.

Additionally, FIG. 10 illustrates changes in a phase of a Zn—Mg alloy thin film according to the exemplary embodi-

| | No | Temperature of steel sheet before coating (° C.) Not cooled | cooled | Coating composition (Mg wt %) | Temperature of steel sheet after coating (° C.) Not cooled | cooled | Surface grain size (μm) | Surface color | Adhesiveness (0T Bending) | SST (time consumed until rust was generated) (hr) | Phase composition (X-ray diffraction) |
|---|---|---|---|---|---|---|---|---|---|---|---|
| Zn—Mg alloy | 1 | 100 | — | 3 | 162 | — | 200 or more | Dark Gray + Brown | NG | 156 | Zn + $MgZn_2$ |
| | 2 | 100 | — | 6 | 175 | — | 99 | Dark Gray | NG | 276 | Zn + $MgZn_2$ + $Mg_2Zn_{11}$ |
| | 3 | — | 28 | 3 | — | 53 | 89 | Metal Bright | OK | 204 | Zn + $Mg_2Zn_{11}$ |
| | 4 | — | 28 | 6 | — | 58 | 79 | Metal Bright | OK | 324 | Zn + $Mg_2Zn_{11}$ |
| | 5 | — | 27 | 13 | — | 59 | 37 | Metal Bright | NG | 240 | Zn + $MgZn_2$ + $Mg_2Zn_{11}$ |
| Zn (EG) | 6 | | | Reference | | | 200 or more | White Gray | OK | 20 | Zn Only |

No. 1, No. 2, and No. 5 in Table 1 are comparative examples, No. 6 is a reference example, and No. 3 and No. 4 are inventive examples.

As No. 1 and No. 2 indicate, when a steel sheet is not cooled before and after the steel sheet is coated, an average size of surface grains of a Zn—Mg alloy-plated steel sheet having an Mg content of 8 wt % or less was relatively large, 90 μm or greater, and as a $MgZn_2$ phase is formed, basic corrosion resistance of the Zn—Mg alloy-plated steel sheet is relatively great as compared to corrosion resistance of the electric zinc-plated steel sheet EG. However, adhesiveness of a thin film of the Zn—Mg alloy-plated steel sheet is inferior due to an increase in brittleness of the thin film. In a case of a thin film of No. 1 having an Mg content of 3 wt %, an average size of surface grains thereof is hundreds of micrometers, which is relatively large, and brown spots noticeably appear on a surface of the thin film when observed with the naked eye due to a formation of a plurality of voids. Here, the average size of surface grains thereof may be relatively large and brown spots may noticeably appear, because under temperature conditions in which grain ment of the present disclosure 1 when the thin film is synthesized as an Mg content thereof gradually increases from 0 wt %.

Referring to FIG. 10, as an Mg content increases under a condition in which a Zn phase is 100%, $Mg_2Zn_{11}$, a first alloy phase, starts to be synthesized. At an early stage of a formation of the alloy phase, the alloy phase is a Zn-rich phase in which Zn accounts for the majority thereof. However, when the Mg content is 3 wt %, a phase fraction of $Mg_2Zn_{11}/Zn$ becomes 1, and after that, as the Mg content increases, the alloy phase is transformed to a $Mg_2Zn_{11}$-rich phase in which $Mg_2Zn_{11}$ phases account for the majority thereof. From a time in which the $Mg_2Zn_{11}$ phases having relatively high corrosion resistance account for the majority thereof, corrosion resistance thereof increases dramatically. After that, as the Mg content therein increases, a proportion of the $Mg_2Zn_{11}$ phases may be the highest when the Mg content is 7 to 8 wt %, and here, the phase fraction of $Mg_2Zn_{11}/Zn$ is 3. In addition, when the Mg content increases to 8 wt % or greater, a $MgZn_2$ phase, a second alloy phase, starts to be formed.

Referring to such a change in the phase fraction, and to cost, corrosion resistance, and adhesiveness, relatively the best phase fraction may be desirably obtained when the phase fraction of $Mg_2Zn_{11}/Zn$ is between 1 and 3, or in other words, when ratio of Zn to $Mg_2Zn_{11}$ is between 1:1 and 1:3.

The invention claimed is:

1. A zinc (Zn)-magnesium (Mg) alloy-plated steel sheet, comprising:
a base steel sheet; and
a Zn—Mg plating layer formed on the base steel sheet,
wherein an Mg content of the Zn—Mg plating layer is 8 wt % or less and higher than 0 wt %,
the Zn—Mg plating layer is a complex phase of Zn and $Mg_2Zn_{11}$, and
an average size of surface grains of the Zn—Mg alloy-plated steel sheet is 90 μm or less and higher than 0 μm.

2. The zinc (Zn)-magnesium (Mg) alloy-plated steel sheet of claim 1, wherein a phase ratio of Zn to $Mg_2Zn_{11}$ is 1:1 to 1:3 in the complex phase.

3. The zinc (Zn)-magnesium (Mg) alloy-plated steel sheet of claim 1, wherein a thickness of the Zn—Mg plating layer is 1 μm to 3 μm.

4. The zinc (Zn)-magnesium (Mg) alloy-plated steel sheet of claim 1, wherein the base steel sheet is a cold-rolled steel sheet or a hot-rolled steel sheet.

5. The zinc (Zn)-magnesium (Mg) alloy-plated steel sheet of claim 1, wherein an Mg content of the Zn—Mg plating layer is 6.3 wt % or less (but above 0 wt %).

* * * * *